United States Patent
Mayer

(10) Patent No.: US 10,209,311 B2
(45) Date of Patent: Feb. 19, 2019

(54) SWITCHING STATE OF A MECHANICAL SWITCH

(71) Applicant: Lisa Draexlmaier GmbH, Vilsbiburg (DE)

(72) Inventor: Florian Mayer, Seyboldsdorf (DE)

(73) Assignee: Lisa Draexlmaier GmbH, Vilsbiburg (DE)

(*) Notice: Subject to any disclaimer, the term of this patent is extended or adjusted under 35 U.S.C. 154(b) by 0 days.

(21) Appl. No.: 15/814,425

(22) Filed: Nov. 16, 2017

(65) Prior Publication Data
US 2018/0136284 A1 May 17, 2018

(30) Foreign Application Priority Data

Nov. 17, 2016 (DE) .......... 10 2016 122 115

(51) Int. Cl.
| | |
|---|---|
| G01R 31/36 | (2006.01) |
| G01R 31/00 | (2006.01) |
| G01R 31/327 | (2006.01) |
| B60W 10/26 | (2006.01) |

(52) U.S. Cl.
CPC ....... *G01R 31/3606* (2013.01); *G01R 31/006* (2013.01); *G01R 31/3274* (2013.01); *G01R 31/3275* (2013.01); *G01R 31/3277* (2013.01); *B60W 10/26* (2013.01)

(58) Field of Classification Search
CPC ............ G01R 31/3606; G01R 31/3275; G01R 31/3274; G01R 31/006; B60W 10/26
See application file for complete search history.

(56) References Cited

U.S. PATENT DOCUMENTS

| | | | | |
|---|---|---|---|---|
| 5,963,277 | A * | 10/1999 | Kim .............. | G06F 3/0412 349/12 |
| 2006/0226706 | A1* | 10/2006 | Edelen ........... | H02J 9/06 307/64 |
| 2010/0264883 | A1* | 10/2010 | Aiura ............ | H02J 7/0091 320/150 |
| 2014/0084893 | A1* | 3/2014 | Chen ............. | G05F 5/00 323/299 |

FOREIGN PATENT DOCUMENTS

| | | |
|---|---|---|
| DE | 102006050529 | 4/2008 |
| DE | 102014117417 | 6/2016 |

\* cited by examiner

*Primary Examiner* — Huy Q Phan
*Assistant Examiner* — Zannatul Ferdous
(74) *Attorney, Agent, or Firm* — Burris Law, PLLC

(57) ABSTRACT

A circuit for monitoring a switching state of a mechanical switch is provided that includes a first mechanical switch configured to couple a high-voltage power storage device to a load, a measuring device that measures a voltage characteristic at the first mechanical switch, the measuring device is being connected to the first mechanical switch via a first measuring resistor such that a voltage drop at the first mechanical switch is measurable over a period of time, an insulation-monitoring unit having a first switchable resistor that can be switched in during measuring such that a voltage divider formed by two or more insulation resistors (R_iso+, R_iso−) of the high-voltage power storage device is modified, and an evaluation device that compares the measured voltage characteristic at the first mechanical switch with a predefined threshold value so that the switching state of the first mechanical switch can be determined.

18 Claims, 5 Drawing Sheets

SWITCHING STATE OF A MECHANICAL SWITCH

CROSS-REFERENCE TO RELATED APPLICATIONS

This application claims priority to and the benefit of German Patent Application No. DE 10 2016 122 115.5 filed on Nov. 17, 2016. The disclosure of the above application is incorporated herein by reference.

FIELD

The present disclosure relates to a circuit and to a method for monitoring the switching state of a mechanical switch, as in a high-voltage system.

BACKGROUND

The statements in this section merely provide background information related to the present disclosure and may not constitute prior art.

High-voltage systems such as high-voltage on-board electrical systems are used, for example, in electric or hybrid vehicles. A high-voltage on-board electrical system includes a high-voltage power storage device such as a high-voltage battery that makes a high voltage available for supplying a load coupled to the high-voltage power storage device.

When mechanical switches in high-voltage on-board systems are actuated, the momentary switching state is frequently not known. However, especially in failsafe critical applications such as coupling the high-voltage power storage device to the load, it is important to know whether the mechanical switch is open or closed or whether there is a malfunction.

One known solution provides that the voltage dropping at the mechanical switch be monitored and compared to a defined threshold value. With this comparison it is possible to recognize whether the mechanical switch is open or closed. Evaluating the characteristics of the voltage dropping at the mechanical switch is also known.

One of the issues involved in determining the switching state of these mechanical switches resides in ascertaining and identifying suitable threshold values that enable reliable recognition of the switching state under as many (variable) boundary conditions and/or system states of the high-voltage on-board electrical system as possible. Here the voltage drops to be evaluated at the mechanical switches depend heavily on the capacitances and resistances present in the system. Voltages may differ depending on the field of application, for which reason it is sometimes difficult to evaluate the voltage drops by comparison with the defined threshold value or in evaluating the voltage characteristics. Thus, a reliable evaluation is not always possible.

An open mechanical switch may be recognized as being closed if the voltage drop used for comparative purposes lies below the defined threshold value. This can be caused, for example, by altered boundary conditions and/or system states. The mechanical switch is then erroneously recognized as being closed and/or defective, when in fact it has been properly opened and is in working order. False recognition of the switching state of the mechanical switch can lead to malfunctions in the high-voltage on-board electrical system.

DE 10 2014 117 417 A1 discloses a battery management system for a high-voltage battery, the battery management system comprising a switching device with controllable switching elements for establishing and disconnecting the electrical connection between the poles of the high-voltage battery and the connection points for a consumer network; a device for insulation monitoring, wherein the poles and the connection points are each switched via a voltage divider to a reference potential for insulation measurement, characterized in that the battery management system further comprises a device for checking the switching status of the controllable switching elements by measuring devices to determine the electrical voltage, wherein the measuring devices are arranged so that they measure the voltage between output of the respective voltage divider and the reference potential, and wherein the device for checking the switching status of the controllable switching elements has a device for comparing the measured voltage values of those two measuring devices with a controllable switching element switched between each of their assigned voltage dividers.

DE 10 2006 050 529 A1 describes a switching arrangement to monitor the insulation and contactors of the power supply of an electric drive, comprising a battery to supply the power to the electric drive; power electronics fed by the battery to actuate an electric motor of the electric drive; one or more contactors for the all-pole electrical disconnection of the battery from the power electronics; a voltage source connected to a reference potential to generate a measuring voltage for monitoring the insulation and the contactors; two voltage measuring devices to measure a voltage excursion produced by the measuring voltage in relation to the reference potential, wherein the voltage source and a first voltage measuring device are electrically connected to a feed point for supplying the measuring voltage and a second voltage measuring device is electrically connected to a measuring point for measuring the voltage excursion, and the feed point and measuring point are arranged such that the at least one contactor is connected between them.

There is a demand for a simpler and more reliable way to recognize the switching state of the mechanical switch through which a high-voltage power storage device is capable of being coupled especially to a load.

SUMMARY

Switching in the connectable resistor of the insulation-monitoring unit causes a voltage divider formed by two or more insulation resistors of the high-voltage power storage device to be variable.

The mechanical switch couples the high-voltage power storage device to the load. The voltage dropping at the mechanical switch is essentially determined by the above-described voltage divider of the high-voltage power storage device and by voltage drops caused by the load at the mechanical switch, such as an additional load-side voltage divider. This may be formed by additional insulation resistors of the load such as those frequently encountered as a load in a vehicle-side intermediate circuit.

Thus, the voltage dropping at the mechanical switch is essentially determined by the voltage divider of the high-voltage power storage device and by a load-side voltage divider. The ratio of these two voltage dividers to one another may be altered by switching in the connectable resistor of the insulation-monitoring unit, so that the voltage dropping at the mechanical switch does not approach 0 V through a mutual cancellation of the voltage dividers.

The switch provides that the predefined threshold value is reliably exceeded if the contactor has been properly opened. Correspondingly, if the connectable resistor of the insulation-monitoring unit is not switched in, the ratio of the voltage dividers of the high-voltage power storage device to the load is not changed. The measured voltage characteristics at the mechanical switch can then amount to approximately 0 V. The predefined threshold value is not exceeded. In this case, as a switching state of the mechanical switch it cannot be determined whether the mechanical switch is open or not.

In the present disclosure, components of a high-voltage on-board electrical system can be further used essentially unchanged. Here, for example, a measuring device of high-voltage on-board electrical systems is routinely included. The same is true for an insulation-monitoring unit. For example, the above indicated measuring resistor, with which the voltage characteristics of the mechanical switch are measurable, is already routinely included in high-voltage systems such as high-voltage on-board electrical systems. The same is true for the possibility of feeding a voltage into the load by an insulation-monitoring unit. Thus, the proposed solution may be implemented for the most part without additional effort and/or expense. Hence, the circuit makes it possible to monitor the switching state of a mechanical switch. As a possible switching state, for example, it can be recognized whether the mechanical switch is open or closed. By purposefully using the insulation-monitoring unit to influence the voltage to be evaluated a simple and reliable recognition of the switching state of the mechanical switch may be achieved.

For example the mechanical switch may be a relay or a contactor. The high-voltage power storage device, for example, may be a high-voltage battery with a voltage generally greater than 60 V. Specifically, the voltage of the high-voltage power storage device is greater than 400 V, for instance approximately 480 V or between 900 V and less than 1000 V. An example of the load is a vehicle-side intermediate circuit. This electrical device, as the power storage device, electrically couples several electrical networks on an interposed current or voltage level via convertors. The insulation-monitoring unit, for instance, monitors the insulation resistance of a high-voltage on-board electrical system, thereby implementing a protective function against electric shock. The insulation-monitoring unit can also be referred to as an insulation-monitoring device, insulation monitor, iso-monitor, insulation-monitoring apparatus, iso-guard or ISOMETER. The insulation-monitoring unit is adapted to continuously measure the resistance of an external conductor and of a neutral conductor against earth and to immediately report an insulation defect. The measuring device may be a measuring circuit that measures a voltage dropping across the mechanical switch. The characteristic of the voltage dropping at the mechanical switch can be measured by the circuit. The measured voltage and/or the measured voltage characteristic at the first mechanical switch may include the first voltage fed in by the insulation-monitoring unit. Here, for example, the voltage characteristic can be measured in a (i) chronologically steady, (ii) at least partly continuous, or (iii) discretely steady manner. The measured voltage drop encompasses a time span or interval after the opening or closing of the mechanical switch or after actuation of the mechanical switch for opening or closing the mechanical switch. The time span or interval, for example, may be approximately 200 ms or less. Within this time span or interval it is possible to check whether the amplitude of the voltage characteristic exceeds the predefined threshold value.

The resistor is switched in while the switching state of the voltage characteristic of the mechanical switch is being measured. The voltage characteristic of the voltage dropping at the mechanical switch may be measured after the mechanical switch has been actuated to open or close it. Switching in the resistor of the insulation-monitoring unit provides that if the mechanical switch is properly functioning the predefined threshold value is reliably exceeded.

In addition, it is possible to recognize a malfunction of the mechanical switch. To this end, first of all it is necessary to actuate the mechanical switch to open or close it. The switching state of the mechanical switch is then monitored in accordance with the described switching. Through a correlation between the switching state of the mechanical switch as expected from the actuation and the monitored or identified switching state of the mechanical switch it is possible to recognize a malfunction of the mechanical switch, such as a stuck contactor. The circuit includes an evaluation device by which the measured voltage characteristic at the mechanical switch can be compared to a predefined threshold value. An example of an evaluation device is a battery control device. A battery control device or unit (BCU) represents the interface between the load, such as the vehicle-side connection via an intermediate circuit, and the high-voltage power storage device, such as a battery. Incoming data such as measured values may be processed, calculated, diagnosed and/or communicated by the evaluation device. Corresponding measured values may be transferred from the measuring device to the evaluation device. For example, with the evaluation device it is possible to determine from incoming measured values the state of charge (SoC), the state of health (SoH), and the state of function (SoF) of the high-voltage power storage device. In one form of the present disclosure the evaluation device encompasses monitoring an insulation resistor of the high-voltage power storage device and/or device for the thermo-management of the high-voltage power storage device. In another form given as an example, the evaluation device may include an insulation-monitoring unit. In this case, the arrangement of the insulation-monitoring unit in the circuit is preserved. In addition, the evaluation device may include the measuring device. As an alternative, the evaluation device may include both the insulation-monitoring unit and the measuring device.

Individual values from the mechanical switch, in the present case such as discrete measured values of the voltage characteristic, may be compared with the predefined threshold value by the evaluation device. Several measured values may be compared with the predefined threshold value by the evaluation device, and they may exist in the form of continuous measured values and represent sections or the entire voltage characteristics. It is possible within the framework of the comparison to check whether all measured values or at least a portion of the measured values of the voltage characteristics and/or an individual measured value lies above the defined threshold value. A comparison may be made here to determine whether one or more measured values of the voltage characteristic are greater than or greater than and equal to the value of the predefined threshold value. In another form, a signal based on the comparison may be supplied by the evaluation device. If the predefined threshold value is exceeded, the signal indicates that the mechanical switch is open; if the measured value falls below the predefined threshold value, the signal indicates that the mechanical switch is closed. Thus, the signal can describe at least two states, for instance by two voltage levels that differ from one another. As an alternative, two different signals based on the comparison may be obtained by the evaluation device. A first signal indicates that the mechanical switch is open, for example. The second signal indicates that the mechanical switch is closed. In another form, a signal based on the comparison is obtained by the evaluation device. If the predefined threshold value is exceeded, the signal indicates that the mechanical switch is open. If the measured value falls below the predefined threshold value, in this case no signal can be provided by the evaluation device on the basis of the comparison. In accordance with the aspects described above the circuit makes certain that the predefined threshold value is exceeded, for example, when the mechanical switch has been actuated for opening, and with the mechanical switch subsequently being open and the resistor of the insulation-monitoring unit being switched in. If, contrary to this, the mechanical switch has been actuated for opening but it subsequently remains closed, and the resistor of the insulation-monitoring unit is switched in, the measured value falls below the threshold value. This is an indication of a defective mechanical switch. If a comparison of the voltage characteristic measured after the actuation for closing results in the threshold value not being exceeded, the mechanical switch is closed. A defect or malfunction of the mechanical switch may be recognized as given below and is the case, for example, if the mechanical switch has been actuated for opening and the comparison shows that the predefined threshold value has not been exceeded. Accordingly, the switching reveals that the mechanical switch is closed. Since the mechanical switch has been actuated for opening, it follows that a malfunction of the mechanical switch is at hand. Given, for example, that the mechanical switch is a contactor, the defect occurring may be that the contactor is stuck. If, on the other hand, the mechanical switch is actuated for opening and the switch is subsequently open and the resistor of the insulation-monitoring unit is not connected, the measured voltage characteristic of the properly opened mechanical switch can lie below the predefined threshold value. This could be caused by boundary conditions and system parameters that influence the voltage dropping at the mechanical switch. In that case, the voltage characteristic of the mechanical switch does not exceed the predefined threshold value. The proposed circuit makes it possible, by switching in the resistor of the insulation-monitoring unit, that the voltage dropping at the mechanical switch can be varied by the voltage divider function of the switched-in resistor in such a manner that the predefined threshold value is exceeded if the mechanical switch is in proper working order.

In one form given as an example the insulation-monitoring unit also includes a second switchable resistor adapted to be switched in during the measurement of the voltage characteristic at the first mechanical switch. By the switching in, the voltage divider formed by the at least two insulation resistors of the high-voltage power storage device is modifiable.

In a further form given as an example the first and the second resistors of the insulation-monitoring unit are alternately switchable.

One of the two switchable resistors may be switched in immediately following a completed actuation of the mechanical switch. Actuating the switch causes the mechanical switch to open or close. The alternating changeover between the two switchable resistors may take place following a predefined time period, for instance of approximately 100 ms, meaning that the first resistor is switched off and the second resistor is switched in. Another changeover between the switchable resistors may be carried out after another predefined time span such as approximately 100 ms. The changeover of the switchable resistors here affects the voltage dropping across the mechanical switch, so that the measured voltage characteristic of this voltage dropping at the mechanical switch is influenced. The voltage dropping at the mechanical switch is in this case capable of being amplified or differentiated depending on the switchable resistor. Furthermore, it is conceivable that an insulation-monitoring unit may have three or more switchable resistors with dimensions that enable amplification or modification in defined steps of the voltage dropping at the mechanical switch. In this manner it can be provided that under widely varied boundary conditions or system parameters it is possible in a high-voltage system such as a high-voltage on-board electrical system to achieve simple and reliable recognition or monitoring of the switching state of the mechanical switch.

In accordance with one form given as an example, the circuit comprises a second mechanical switch by which the high-voltage power storage device can be coupled to the load.

Another form provides that the evaluation device the measured voltage characteristic at the second mechanical switch can be compared with the predefined threshold value, so that the switching state the second mechanical switch can be determined.

Another form given as an example provides that the measuring device is adapted to be connected to the second mechanical switch via a second measuring resistor in such a manner that a voltage drop at the second mechanical switch can be measured over a period of time.

The measured voltage or the measured voltage characteristic at the second mechanical switch may include the second voltage fed in by the insulation-monitoring unit.

In another form provided as an example, the circuit includes a supply line and a ground conductor, with the first switchable resistor being connected in a switchable manner to the supply line and with the second switchable resistor being connected in a switchable manner to the ground conductor.

An IT system (IT: isolé terre) provides for the use of a separate supply line and a separate ground conductor. The ground conductor here is used as chassis ground.

The supply line is also referred to below as "HV+" and the ground conductor, which serves as earthing line, is referred to as "HV−".

Due to the separate ground conductor, in the IT system the Earth does not serve as chassis ground. "HV+" and "HV−" may be guided via separate lines from the high-voltage power storage device to components such as the insulation-monitoring unit, measuring device, or load. Through the use of "HV−", for example, the body of a vehicle is not used as chassis ground. This provides that the high-voltage system of a (vehicle) ground is electrically isolated.

The first and the second switchable resistors are encompassed by the insulation-monitoring unit. For example, the first and the second switchable resistors may be connected in series, with an equipotential predominating between the first and the second switchable resistors. The equipotential, for example, is a chassis ground provided by a vehicle body. Accordingly, the first switchable resistor is located in a part of the circuit that is fed by the supply line. The second switchable resistor is located in a part of the circuit comprised by the ground conductor as the earth line.

According to one form given as an example, the measuring device and/or the insulation-monitoring unit is arranged between the high-voltage power storage device such as the vehicle-side intermediate circuit and the load and is parallel connected to them.

A further form given as an example provides that the high-voltage power storage device is connected via the evaluation device and the measuring device to the load, for instance the vehicle-side intermediate circuit. In an additional form of the circuit, the first or the first and second mechanical switches are arranged between the measuring device and the load. When the first and/or second mechanical switch is open, the load is disconnected from the high-voltage power supply device, the insulation-monitoring unit and the measuring device. The disconnection may be an electrical isolation, for example.

In one form given as an example, the circuit is set up from the high-voltage power storage device to the load in the following order:

(i) high-voltage power storage device; (ii) insulation-monitoring unit; (iii) measuring device; (iv) first or first and second mechanical switch; (v) load. The voltage source is made available by the high-voltage power storage device. The insulation-monitoring unit is connected in parallel to the high-voltage power storage device. An evaluation device that includes the insulation-monitoring device may optionally be parallel-connected to the high-voltage power storage device. The measuring device is connected directly parallel with the insulation-monitoring unit. The evaluation device or the evaluation device that includes the insulation-monitoring unit may optionally include the measuring device. The measuring device is adapted to be coupled to a load such as a vehicle-side intermediate circuit via at least one mechanical switch or, in one form, two mechanical switches such as contactors or relays. No additional components are arranged between the individual components of the circuit, which are connected in parallel.

In one form presented as an example, a signal based on the comparison may be generated by the evaluation device. If the predefined threshold value is exceeded, the signal indicates that the first and/or the second mechanical switch is open, and/or if the predefined threshold value is not exceeded the signal indicates that the first and/or second mechanical switch is closed.

The form described above as examples for alternative signals possibly provided by the evaluation device can likewise be indicative of an open second mechanical switch.

In one form of the circuit according to one of the preceding aspects, the evaluation device and the insulation-monitoring unit are connected in such a manner that control signals and/or measured data can be transferred between them.

In an additional form the method also includes one or more of the following aspects:

Aspect 2:

A method according to one or more of the preceding aspects, including the step of:

switching in a second switchable resistor during the measurement of the voltage characteristic at the second mechanical switch, wherein the voltage divider formed by the at least two insulation resistors of the high-voltage power storage device is modified by the connecting of the second switchable resistor.

Aspect 3:

The method according to one or more of the preceding aspects, including the step of:

alternating the connecting of the first and the second resistors of the insulation-monitoring unit.

Aspect 4:

The method according to one or more of the preceding aspects, including the step of:

measuring a voltage characteristic at a second mechanical switch, by which the high-voltage power storage device can be coupled to the load, wherein a voltage drop at the second mechanical switch is measured over a time span.

Another example of an aspect proposes a device including carrying out and/or controlling a described method. According to an additional aspect a motor vehicle is described that includes a described circuit for monitoring the switching state of a mechanical switch. An aspect given as an example proposes a motor vehicle including carrying out and/or controlling a described method. The forms depicted above as examples in this description shall also be understood as being disclosed in all combinations with one another. Especially, various forms given as examples should be understood to refer to the different aspects. In particular, with the above or the following description of method steps according to various forms of a method, corresponding elements for performing the method steps shall also be disclosed by forms given as examples of a circuit according to the aspects described. Likewise, with the disclosure of elements of a device for carrying out a method step the corresponding method step shall also be disclosed. Additional forms given as examples are found in the following detailed description of several such forms, particularly in conjunction with the accompanying drawings. However, the drawings are intended to serve merely as clarification but not to define the scope of protection. They should merely reflect the general concept as examples. Specifically, features contained in the drawings should by no means be considered to be essential components.

The above-described properties, features and advantages of the present disclosure, as well as the manner in which they are achieved, will become clearer and more easily understood in the following schematic description of one form, and they are explained below in greater detail with reference to the drawings. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings, in which.

Figure 1:
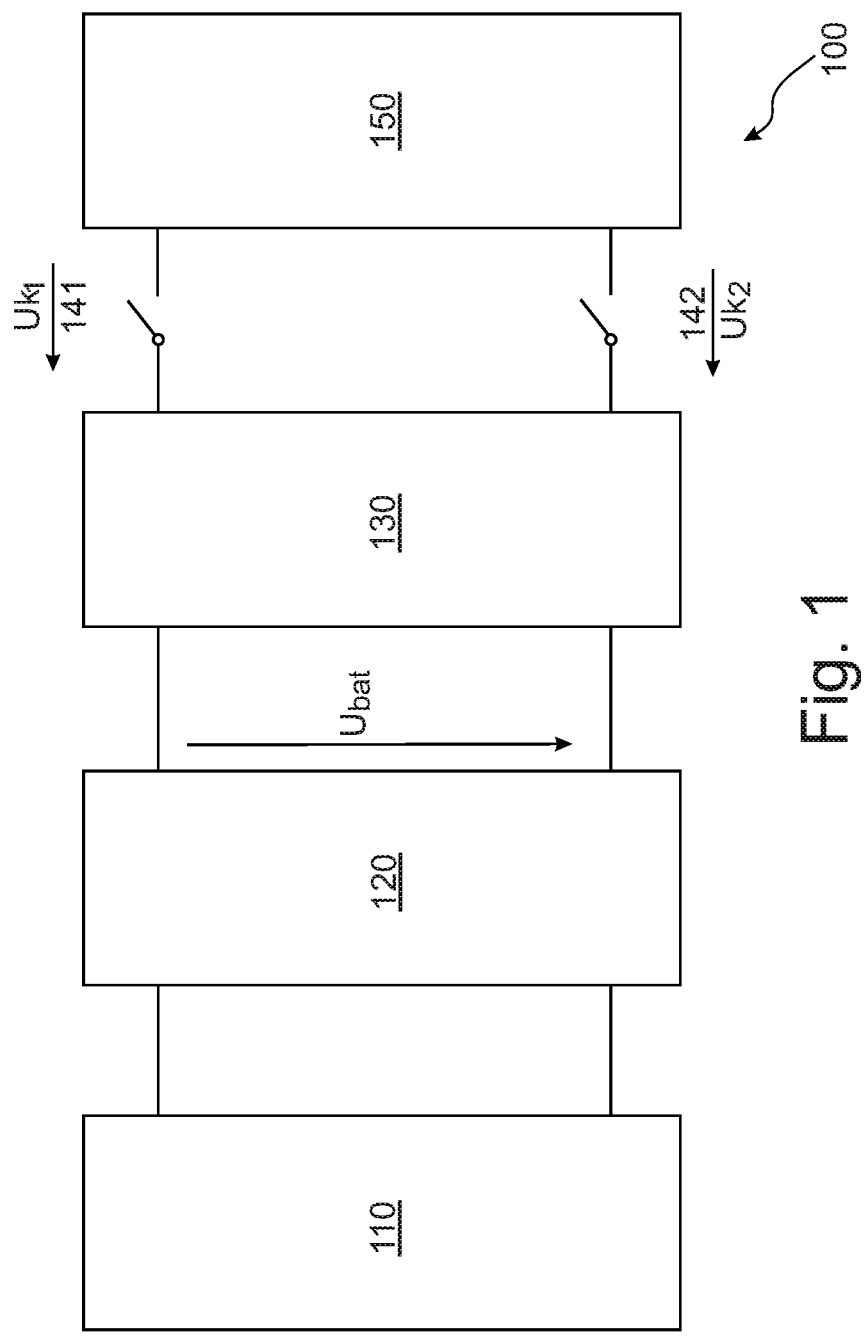
FIG. 1 shows a schematic diagram of a circuit configuration in one form of a circuit according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a schematic diagram of a circuit configuration of one form of a circuit in accordance with the present disclosure.

The circuit 100 includes a high-voltage power storage device 110 such as a high-voltage battery, an insulation-monitoring unit 120, a measuring device 130, two mechanical switches 141, 142, by which the high-voltage power storage device 110 can be coupled to a load 150.

The components 110 to 150 together constitute a high-voltage system such as a high-voltage on-board electrical system.

One voltage characteristic each is measurable at the mechanical switch 141, 142 by the measuring device 130. For this purpose the measuring device 130 can be switched to one of the mechanical switches 141, 142 in such a manner that a voltage drop (Uk1, Uk2) can be measured over a period of time at the respective mechanical switch 141, 142.

Figure 2:
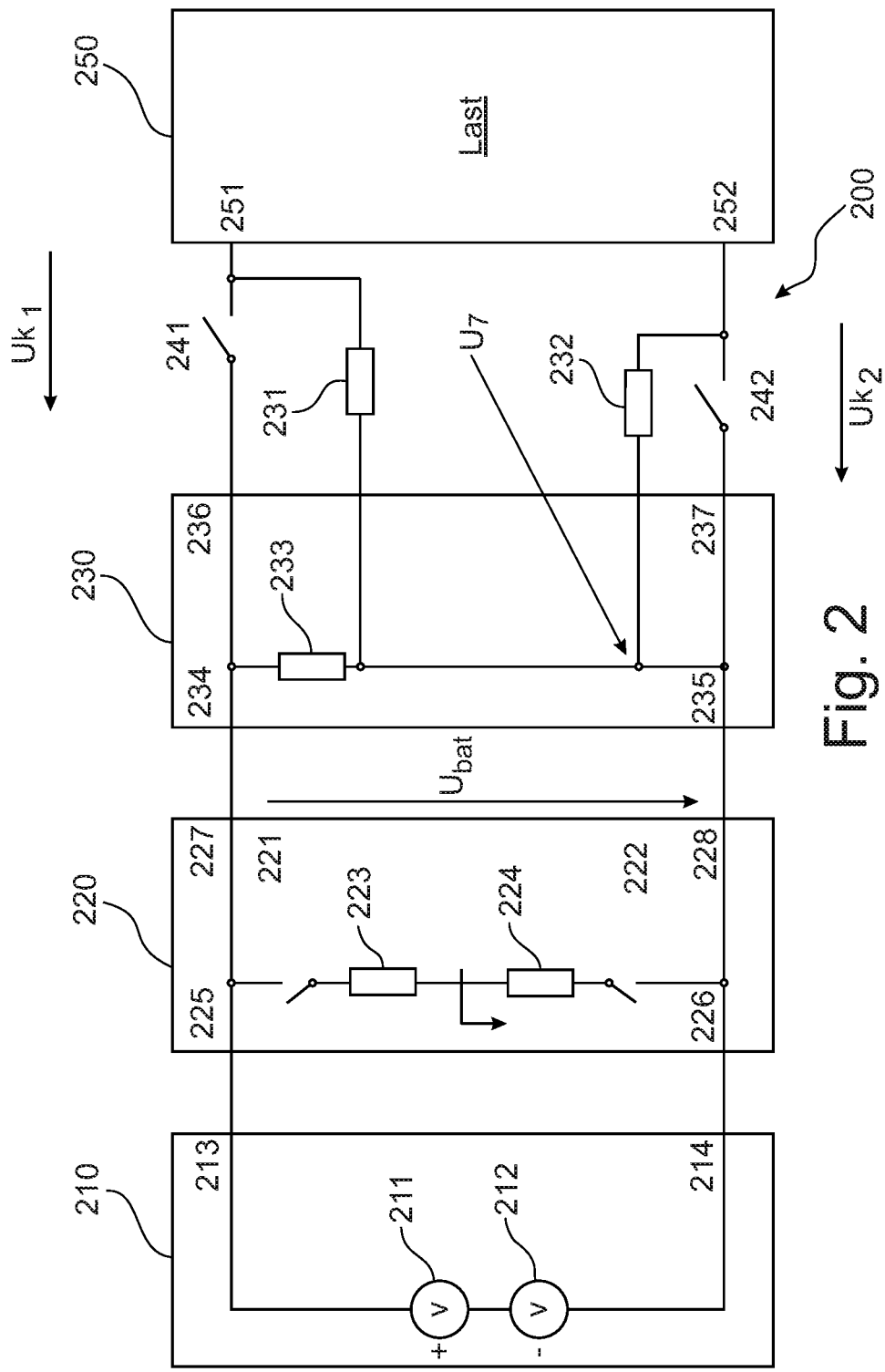
FIG. 2 shows a schematic diagram of a circuit configuration in another form of a circuit according to the present disclosure.
Figure 3:
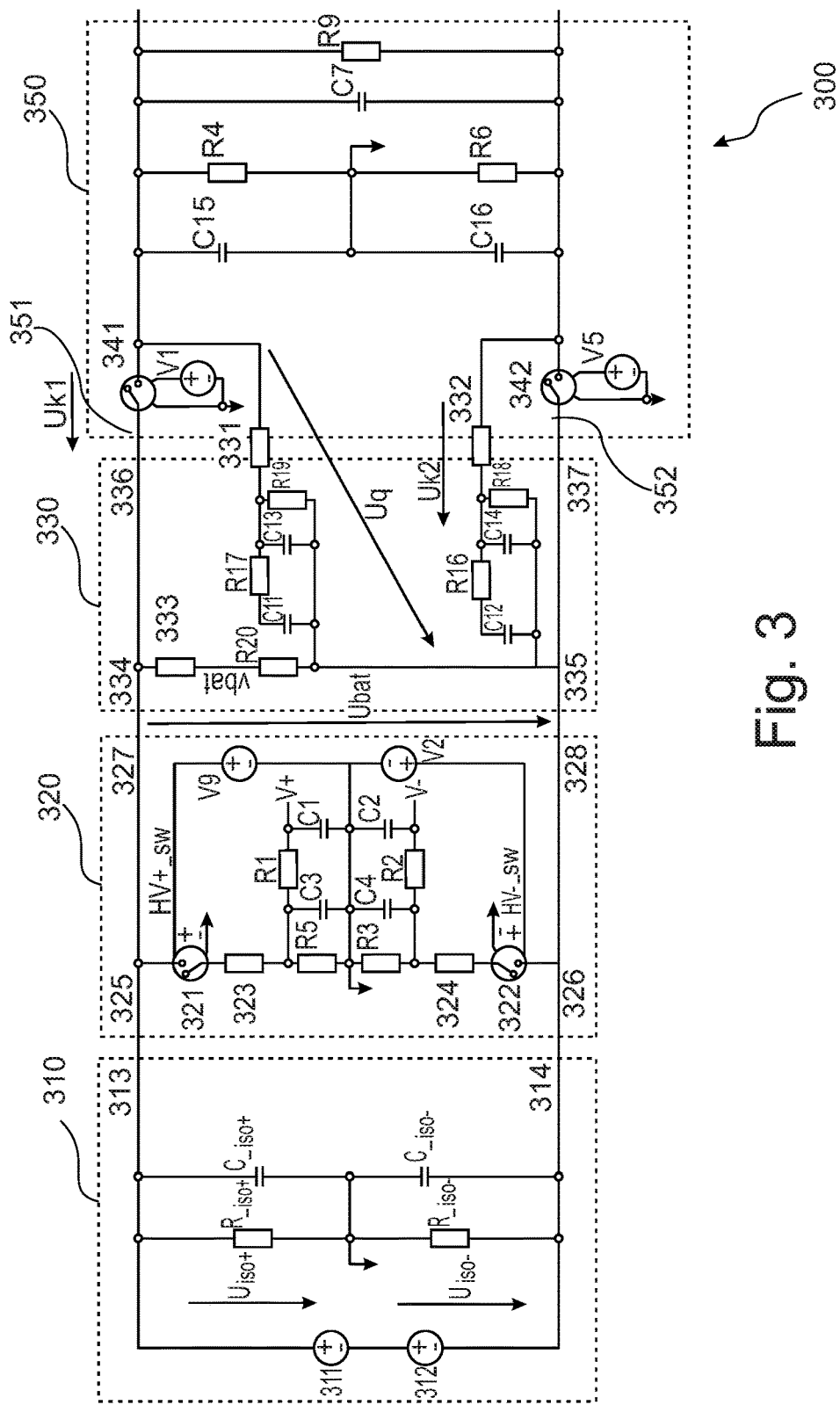
FIG. 3 shows a detailed schematic diagram of a circuit configuration in another form of a circuit according to the present disclosure.

The insulation-monitoring unit 120 includes one or more switchable resistors such as resistor 223, 224 according to FIG. 2 or 323, 324 according to FIG. 3, wherein the resistor can be connected during the measurement of the voltage characteristic at the mechanical switches 141, 142. By the connection of the resistor the voltage drop at the respective mechanical switch 141, 142 can be altered in such a manner that the switching state of the respective mechanical switch 141, 142 can be determined.

The voltage drop at the mechanical switches 141, 142 is designated with Uk1 or Uk2, respectively, in FIG. 1. The voltage made available, for instance as supply voltage, by the high-voltage power storage device is designated with Ubat in FIG. 1.

FIG. 2 shows a schematic drawing of a circuit configuration in another form of a circuit according to the present disclosure. The circuit 200 includes a high-voltage power storage device 210, an insulation-monitoring unit 220, a measuring device 230, two mechanical switches 241 and 242, and a load 350 that can be coupled to the high-voltage power storage device 310 via the mechanical switches 241, 242.

The high-voltage power storage device 210 in the present case is a high-voltage battery with two series-connected voltage sources HV+ and HV−.

The insulation-monitoring unit 220, also referred to as IsoMonitor, includes two switchable measuring resistors 223, 224, switched in via two mechanical switches 221, 222 such as contactors.

The measuring device 230 includes at least three measuring resistors 231 to 233, with measuring resistor 233 being connected in series to the (parallel-connected) measuring resistors 231 and 232. The measuring resistors 231 and 232 are connected to one another on one side through a common node and on the other side through the intermediate circuit. The measuring resistors 231, 232 are parallel-connected to respective mechanical switches 241, 242, so that voltage dropping at these switches can be measured by the measuring device 230.

The inputs/outputs 213, 214 of the high-voltage power storage device 210 are connected respectively to the respective inputs/outputs 225, 226 of the insulation-monitoring unit 220. The inputs/outputs 227, 228 of the insulation-monitoring unit 220 are connected respectively to the respective inputs/outputs 234, 235 of the measuring device 230. The inputs/outputs 236, 237 of the measuring device 230 can be coupled via the mechanical switches 241, 242 to the inputs/outputs 251, 252 of the load 250.

Together, the high-voltage energy storage device 210, the insulation-monitoring unit 220, the measuring device 230, the mechanical switches 241, 242 and the load 250 form an example of one form of a high-voltage system. A high-voltage system of this type may be put to use in a high-voltage on-board electrical system such as those commonly found in electric or hybrid vehicles.

In one form, the circuit 200 monitors the particular switching state of the mechanical switches 241 and 242.

The voltage characteristics at the particular mechanical switches 241, 242 can be measured with the measuring device 230. Here the measuring device 230 can be switched to the mechanical switch in such a manner that a voltage drop at the mechanical switch can be measured over a period of time. For this purpose the measuring device can be connected in parallel via the measuring resistors 231, 232 and 233 to the respective mechanical switches 241, 242. In the present case the measuring device 230 can be connected parallel to the mechanical switch 241 via the measuring resistor 231 and parallel to the mechanical switch 242 via the measuring resistor 232. The voltage Ubat is applied between the input/output 234 and the input/output 235 and corresponds to the voltage supplied by the high-voltage power storage device. In addition, the voltage Uq is applied between the mechanical switch 241 and the input/output 235 of the measuring device and can be measured by the measuring device 230.

In one form given as an example, one or more of the voltages Uk1, U1, Ubat and Uk2 measured by the measuring device 230 may be transferred directly to the insulation-monitoring unit 220, for instance via a communications link existing between them.

The switchable resistors 223, 224 of the insulation-monitoring unit 220 can be switched in during measurement of the voltage characteristic at one or more of the mechanical switches 241, 242. By arranging the measuring resistors 223, 224 of the insulation-monitoring unit parallel to the measuring resistors 231 to 233 of the measuring device 230, the respective voltage drop Uk1 or Uk2 at the mechanical switches 241, 242 can be altered in such a manner by switching in one of the measuring resistors 223, 224 that the switching state of the mechanical switch 241, 242 can be determined.

For this purpose, one form given as an example provides that the voltages Uk1 and Uk2 can be measured or determined on the basis of the voltages measured by the measuring device 230. If, for example, the voltages Uq, Uk2 and Ubat are measured by the measuring device 230 or if the corresponding voltage characteristics of these voltages are measured over a period of time, then the voltage Uk1 can be calculated with the formula Uk1=Uq−Ubat, for instance by an evaluation device. In one version an evaluation device of this type comprises the insulation-monitoring unit 220. Once the voltage characteristics of the voltages Uk1 and Uk2 have been measured or calculated, a comparison of the voltage characteristics or the values of the voltage characteristics Uk1 and/or Uk2 with a predefined threshold value can be made. If these voltages Uk1 and Uk2 exceed a predefined threshold value, a sure opening or closing of the respective mechanical switch can be recognized. If a mechanical switch is closed, as is the case if a contactor is stuck, then the voltage dropping across the mechanical switch approaches 0 V. Correspondingly, a predefined threshold value may be 10

V, for example. Setting the predefined threshold value here depends among other things on the measuring accuracy of the measuring device 230.

FIG. 3 shows a detailed schematic diagram of a circuit configuration of another form of a circuit in a high-voltage system according to the present disclosure. The circuit 300 includes a high-voltage power storage device 310, an insulation-monitoring unit 320, a measuring device 330, two mechanical switches 341 and 342, and a load 350 capable of being coupled to the high-voltage power storage device 310 via the mechanical switches 341, 342.

The high-voltage power storage device 310 in the present case is a high-voltage battery with two series-connected voltage sources HV+ and HV−. An insulation resistor R_iso+, R_iso− and an insulation capacitor C_iso+, C_iso− are parallel-connected to the voltage sources HV+ and HV−, respectively. The series-connected insulation resistors R_iso+, R_iso− affect the magnitude of the voltages Uiso+ and Uiso− dropping there. Accordingly, the insulation resistors form a (battery-side) voltage divider.

The insulation-monitoring unit 320 includes two switchable measuring resistors 323, 324 that are switchable via two mechanical switches, in the present case contactors 321 and 322. The measuring resistors 323 and 324 are each connected to an analog-to-digital converter, so that data and/or information can be converted accordingly by the insulation-monitoring unit or an evaluation device. For example, data and/or information such as a measured voltage characteristic can be transferred from the measuring device 330 to the insulation-monitoring unit 320 or to an evaluation device and a corresponding conversion can be undertaken. An equipotential, which may be chassis ground provided by a vehicle body, predominates between the circuit elements with the switchable measuring resistors 323, 324 of the insulation-monitoring unit.

In one form given as an example, the measuring resistors 323, 324 are alternately switchable via the mechanical switches 321 and 322.

The measuring device 330 includes the measuring resistors 331, 332, 333. As seen in FIG. 3, these measuring resistors 331, 332, 333 are switchable in such a manner that a voltage Uk1, Uk2 dropping at a respective mechanical switch 341, 342 can be measured. A filter element, in this case a low-pass filter, is arranged between the measuring resistor 333 and the measuring resistor 331. This filter element includes the resistor R17 connected in series to the capacitor C11, and respectively parallel-connected to them, the resistor R19 and the capacitor C13.

An additional filter element, in this case a low-pass filter, is arranged between the measuring resistor 333 and the measuring resistor 332. This filter element includes the resistor R16 connected in series to the capacitor C12, and respectively parallel-connected to them, the resistor R18 and the capacitor C14.

The mechanical switches 341, 342 here are designed as contactors.

In the present case the load 350 is an intermediate circuit that, for example, enables the vehicle-side connection to the high-voltage power storage device 310. In one form given as an example, the intermediate circuit forms an inverter to generate a three-phase system from the DC voltage supplied by the high-voltage power storage device 310, to make it possible to operate a corresponding electric motor, for example.

The load 350 includes the vehicle-side insulation resistors R4, R6 and the insulation capacitors C15, C16 arranged in parallel with the resistors. The insulation resistors R4 and R6 here are connected in series and influence the voltage dropping at these respective insulation resistors R4 and R6. The insulation resistors R4 and R6 form a voltage divider.

The circuit 300 enables the monitoring of the switching state of the mechanical switches 341 and 342.

Figure 5:
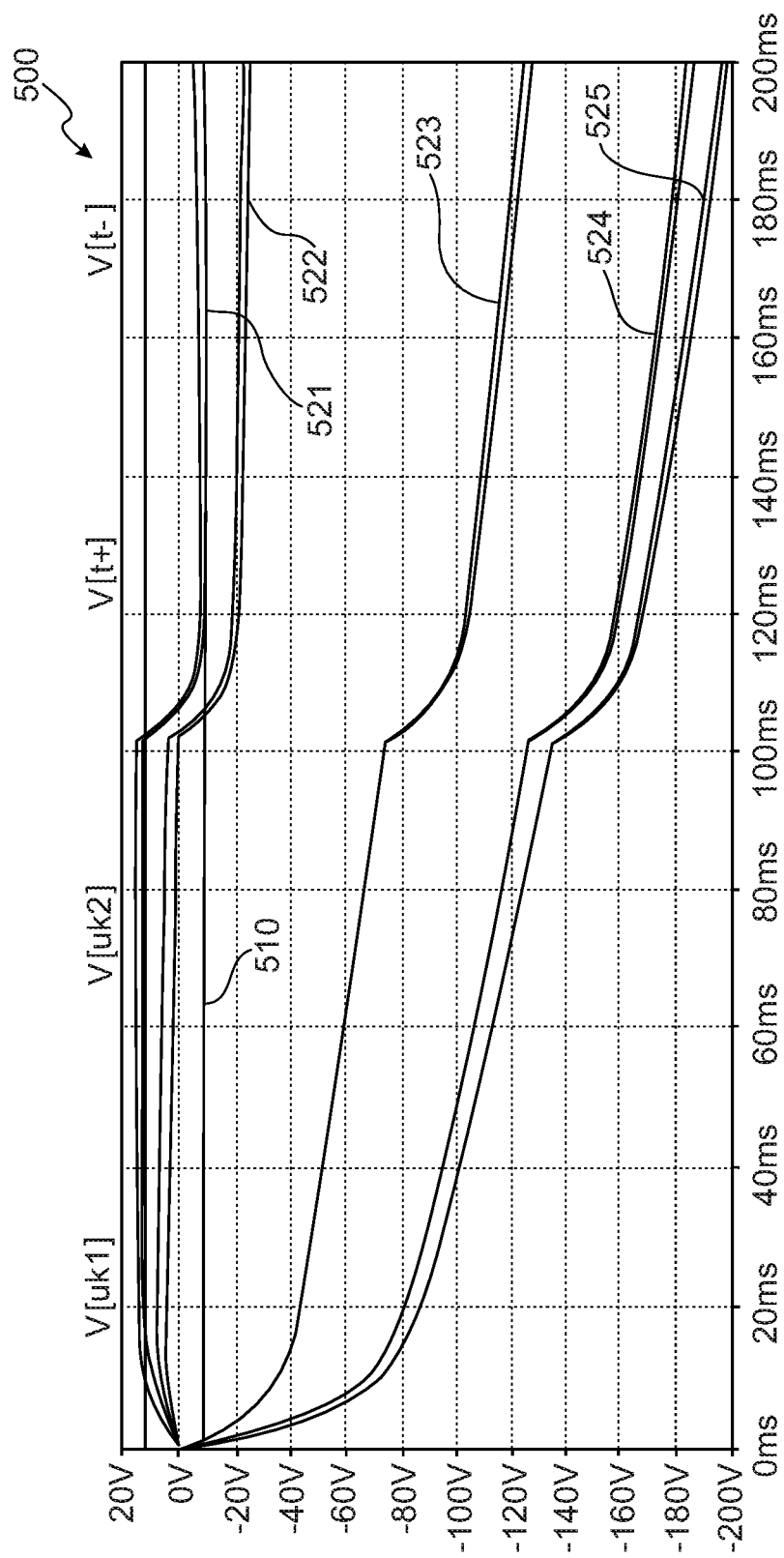
FIG. 5 shows a diagram of an array of curves of voltage characteristics of the circuit according to FIG. 3.

The voltages dropping at the mechanical switches 341 and 342 are designated in the circuit 300 as Uk1 and Uk2, respectively. The voltage Uk1 and/or Uk2 is essentially determined by the ratio of (i) the voltage divider of the insulation resistors R_iso+ and R_iso− of the high-voltage power storage device 310, for instance a high-voltage battery, and (ii) the voltage divider of the insulation resistors R4 and R6 of the load 350, for instance a vehicle-side intermediate circuit. To provide that a predefined threshold value such as threshold value 510 in FIG. 5 is reliably exceeded, making it possible to easily and reliably monitor the switching state of a mechanical switch, a switchable resistor such as 223, 224 in FIG. 2 or 323, 324 in FIG. 3 is connected during the measurement of the voltage characteristic of a voltage (Uk1 or Uk2) dropping at the mechanical switch such as switch 141, 142 in FIG. 1, 241, 242 in FIG. 2, or 341, 342 in FIG. 3. This switching in affects the ratio of the voltage divider according to the insulation resistors R_iso+, R_iso− of the high-voltage power storage device, to the voltage divider according to the insulation resistors R4 and R6 of the load. Depending on the state of the circuit, switching in one of the measuring resistors 323, 324 leads to an integration or differentiation of the voltage drop at the mechanical switches 323, 324. The voltage characteristics of the voltage dropping at a mechanical switch, for instance Uk1 or Uk2, can thus be influenced by the change in the voltage divider ratio of the high-voltage power storage device in such a way that the predefined threshold value of the voltage dropping at the mechanical switch is exceeded. This is true for the case that the mechanical switch to be monitored is in proper working order. From this it can be directly recognized that, correspondingly, if the predefined threshold value is not exceeded even though the switchable resistor of the insulation-monitoring unit has been switched in, then a malfunction of the mechanical switch has occurred.

The voltages Uk1, Uk2 dropping at the mechanical switches 341, 342 are then evaluated. For example, they can be directly measured. As an alternative, in one form given as an example, the voltage Ubat, which corresponds to the voltage supplied by the high-voltage power storage device 310, can also be measured. In addition, in another form given as an example, the voltage Uq which drops between the mechanical switch 341 and the measuring device 330 can also be measured. In one form the voltages Uk2, Uq, and Ubat can be measured with the measuring device 330. Optionally, all voltages Uk1, Uk2, Uq, and Ubat can be measured with the measuring device 330. Correspondingly, in the event that one of the aforementioned voltages cannot be directly measured using the measuring device 330, the measured voltages can be used to calculate one of the other voltages. For example, the voltage Uk1 can be calculated with the formula Uk1=Uq−Ubat. In this case, to obtain the voltage quantities Uk1 and Uk2, the voltages Uk2, Uq and Ubat is measurable with the measuring device. In another form given as an example at least one of the voltages Uk1, Uk2, Uq, Ubat can be measured over a period of time. In this manner, for example, a voltage characteristic for the voltages dropping at the mechanical switches Uk1 and Uk2 can be determined.

In one form, these voltage characteristics are compared to a predefined threshold value, for instance with an evaluation device. For example, the entire voltage characteristic can be compared with the threshold value, or in the case of discretely measured values, the individual values of the voltages of the voltage characteristic can be compared with the predefined threshold value.

One form provides a communications link between the measuring device 330 and the insulation-monitoring unit 320, to supply measured voltages. Information, for instance information in the form of signals, can be transferred between the measuring device 330 and the insulation-monitoring unit 320 via this communications link.

Using an evaluation device, which in one example may include the insulation-monitoring unit 320, a signal may be provided based on the comparison. If the threshold value is exceeded, the signal indicates that one of the mechanical switches 341, 342 is open and/or if the value falls below the threshold value, the signal indicates that one of the mechanical switches 341, 342 is closed.

In one form given as an example, an evaluation device is used to supply a first signal which, if the threshold value is exceeded, indicates that one of the mechanical switches 341, 342 is open; and/or a second signal may be supplied which, if the value falls below the threshold value, indicates that one of the mechanical switches 341, 342 is closed.

If the comparison reveals that the voltages Uk1, Uk2 exceed the defined threshold value then it can be recognized that the mechanical switch is definitely open. In the event that the mechanical switches 341, 342 are designed as contactors, the respective voltage dropping across the contactors approaches 0 V if the corresponding contactor is stuck. If, for example, the contactor 341, 342 is actuated for opening and the particular measured voltage characteristic does not exceed the predefined threshold value, then there is a malfunction of at least that contactor 341, 342 with a voltage characteristic that does not exceed the predefined threshold value. The malfunction may be a stuck contactor.

The following list shows examples of the dimensioning of the components of the circuit 300 according to FIG. 3:
323=324=500 kΩ;
R1=R2=3.3 kΩ; R3=R5=600Ω;
R_iso+=R_iso-=10 MΩ;
R4=R6=10 MΩ;
331=332=333=2160 kΩ;
R16=R17=820Ω;
R18=750Ω;
R19=R20=3.9 kΩ;
C_iso+=C_iso-=C1=C2=C3=C4=C15=C16=1 µF;
C11=C12=150 nF;
C13=1 nF; C14=10 nF.

The order of the components of the circuit is given as an example in the various forms depicted. It is understood that the order of the components of the circuit, for example the high-voltage power storage device, insulation-monitoring unit, measuring device and load, may be modified in any way, as long as the function of the circuit for monitoring a switching state of a mechanical switch is maintained. Accordingly, for example, the measuring device may be connected directly parallel to the high-voltage power storage device, to which in turn the insulation-monitoring unit may be directly connected in parallel. Nor must the first and/or second mechanical switch necessarily be arranged between the measuring device and the load. For example, the first and/or second mechanical switch may be arranged between two other parts of the circuit, so that in this case as well the high-voltage power storage device can be coupled to the load by the first and the second mechanical switch.

Figure 4:
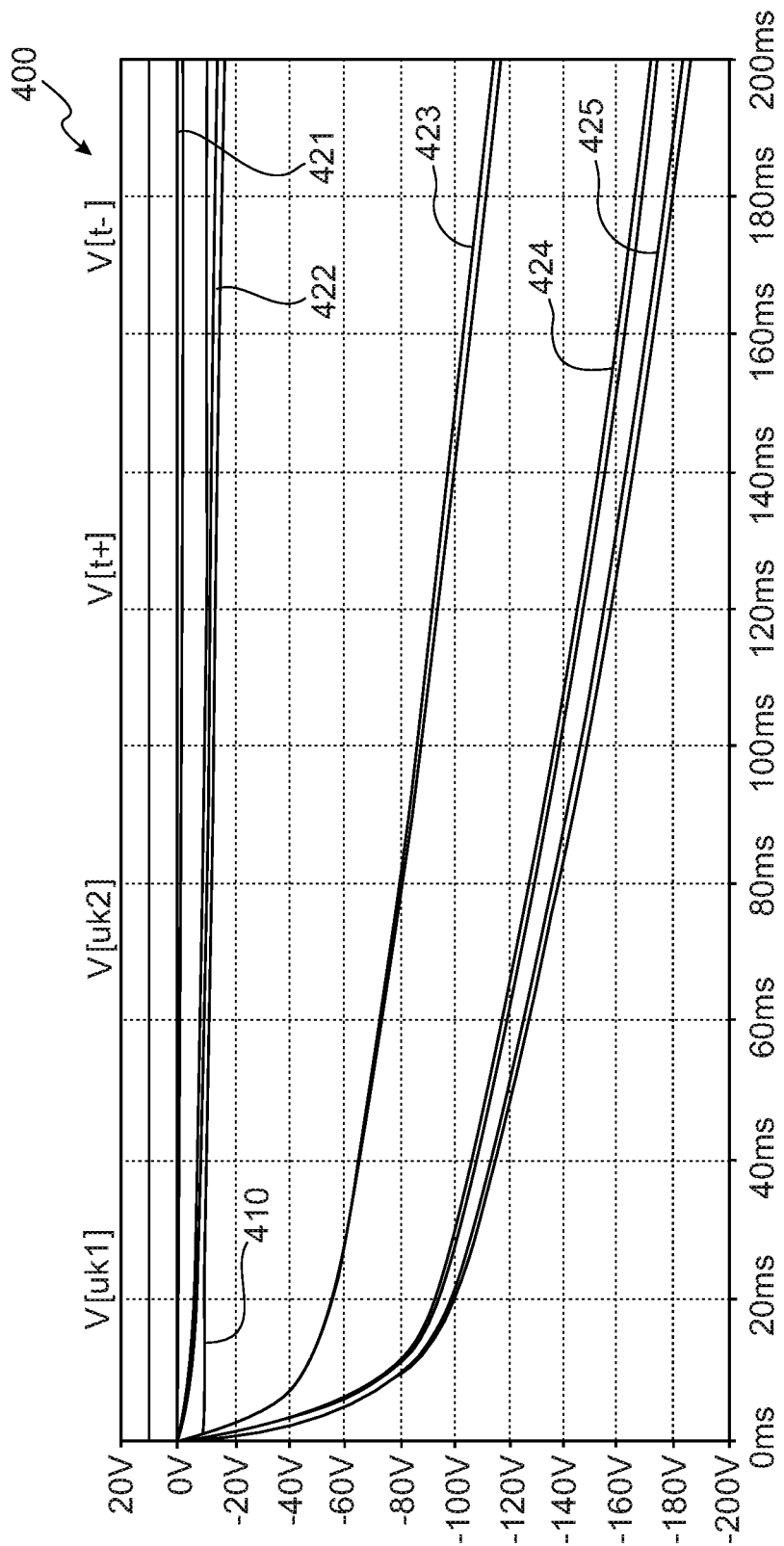
FIG. 4 shows a diagram of an array of curves of voltage characteristics according to the prior art.

FIG. 4 shows a diagram 400 of an array of curves of voltage characteristics 421 to 425 in accordance with the state of the art. The voltage characteristics 421 to 425 map voltage drops Uk1 and Uk2 measured at two respective mechanical switches. A load can be coupled to a high-voltage power storage device via these two mechanical switches. For example, this may be done in accordance with the circuit configuration of the various forms of a circuit according to FIG. 1, 2 or 3.

The x axis (abscissa) of the diagram 400 represents the measured time curve of the unit ms. The y axis (ordinate) of the diagram 400 represents the particular measured voltage at the two mechanical switches at the particular measuring time point.

The designations "V[uk1]" and "V[uk2]" used in the diagram 400 refer to the voltage characteristics 421 to 425 depicted in the diagram 400, which are shown "in pairs." One voltage characteristic from each of the depicted pairs of voltage characteristics 421 to 425 maps the voltage characteristic of the measured voltage Uk1, and the other voltage characteristic from the pairs of voltage characteristics maps the voltage characteristic of the measured voltage Uk2.

The designations "V[t+]" and "V[t-]" in diagram 400 give a predefined threshold value, indicated here at +10 V and at -10 V, respectively, extending parallel to the x axis.

One of these predefined threshold values is designated in diagram 400 with the reference number 410. The predefined threshold value in the present case is set at -10 V. Accordingly, the predefined threshold value 410 in diagram 400 extends parallel to the x axis on the level of -10 V. To monitor a switching state of a first mechanical switch, the measured voltage characteristic of the voltage Uk1 for a first mechanical switch such as switch 141 in FIG. 1, 241 in FIG. 2 or 341 in FIG. 3 must exceed this predefined threshold value 410. To monitor a switching state of a second mechanical switch such as switch 142 in FIG. 1, 242 in FIG. 2 or 342 in FIG. 3, the measured voltage characteristic Uk2 must exceed this predefined threshold value 410.

At time point 0 ms the mechanical switches are actuated to open the previously closed mechanical switch. The voltage drop Uk1 and Uk2 following this actuation at the respective mechanical switches is shown in diagram 400 as an array of curves of the voltage characteristics 421 to 425.

The voltages Uk1 and Uk2 are shown in FIG. 4 without the influence of resistors as depicted, for example, by resistors of an insulation-monitoring unit 120 according to FIG. 1.

The array of curves shown in FIG. 4 is created by a variation of boundary conditions or system parameters, such as by resistors and capacitors present in a high-voltage on-board electrical system. The voltage characteristics of the array of curves differ greatly from one another as a function of these boundary conditions or system parameters.

Voltage characteristics of the array of curves in which there is only a slight deviation from the zero line are to be viewed especially critically. Particularly in the case of these characteristics of the voltages Uk1 and Uk2 a false recognition of the switching state of the mechanical switch can occur. An open mechanical switch can be recognized as being closed, since the voltage characteristic or all measured values of the voltage drops for the measured time span shown in FIG. 4 lie below the specified threshold value 410. In the present case, the voltage characteristic 421 does not exceed the defined 10-V threshold value 410. Determining the switching state of the mechanical switches will erroneously lead to the conclusion that these mechanical switches are closed, even though they were actuated beforehand in order to be opened. Thus, it is assumed that the mechanical switches are stuck. This is a faulty determination of the switching state, which can be avoided with the proposed circuit for monitoring the switching state, as shown, for example, in FIG. 5.

FIG. 5 shows a diagram 500 of an array of curves of voltage characteristics 521 to 525 of one form of a circuit according to FIG. 3. The circuit according to FIG. 3 makes it possible to influence the voltage drops Uk1 and Uk2 at mechanical switches, by which a high-voltage power storage device can be coupled to a load.

As in FIG. 4, FIG. 5 likewise depicts an array of curves of measured voltage characteristics Uk1 and Uk2 of the voltages dropping at two mechanical switches.

Analogously to diagram 400 in FIG. 4, the designations "V[uk1]" and "V[uk2]" used in the diagram 500 refer to the depicted voltage characteristics 521 to 525, which are shown "in pairs." One voltage characteristic from each of the depicted pairs of voltage characteristics 521 to 525 maps the voltage characteristic of the measured voltage Uk1, and the other voltage characteristic from the pairs of voltage characteristics maps the voltage characteristic of the measured voltage Uk2.

The designations "V[t+]" and "V[t−]" in diagram 500 give a predefined threshold value shown here at +10 V and at −10 V, respectively, each extending parallel to the x axis. Corresponding to the statements made relating to diagram 400 in FIG. 4, depending on boundary conditions and/or system parameters, as in a high-voltage system, the measured voltage Uk1 or Uk2 at the mechanical switches is positive or negative, so that to monitor a switching state of a mechanical switch one of the threshold values predefined at +10 V or −10 V is exceeded or undershot, respectively. A predefined threshold value is designated as an example with the reference number 510 in diagram 500. It is also conceivable that to monitor the switching state of a mechanical switch the predefined threshold value is to be exceeded at +10 V. This depends on the boundary conditions and system parameters predominating in a high-voltage system in which the switch 100 in FIG. 1, switch 200 in FIG. 2, or switch 300 in FIG. 3 can be used. The voltages Uk1 and Uk2 dropping at the mechanical switches, for instance 141, 142 in FIG. 1, 241, 242 in FIG. 2, or 341, 342 in FIG. 3 may be positive or negative accordingly.

At time point 0 ms the mechanical switches are actuated to open the previously closed mechanical switches. The voltage drops Uk1 and Uk2 following this actuation at the respective mechanical switches are shown in diagram 500.

In the present case, for example, an insulation-monitoring unit comprises insulation-monitoring unit 120 in FIG. 1, 220 in FIG. 2 or 320 in FIG. 3, two switchable resistors such as resistors 223, 224 in FIG. 2 or resistors 323, 324 in FIG. 3. These resistors of the measuring device are alternately switchable, meaning that one of the two switchable resistors is connected. In the present case, one of the two switchable resistors is switched in at the time point 0 ms. There is a change between the two switchable resistors at 100 ms.

By switching in the resistors the particular voltage characteristic Uk1 or Uk2 of the voltage dropping at the respective mechanical switches can be influenced in such a manner that the defined threshold value (here at −10 V) is exceeded for recognition of an open mechanical switch. In a first state in which the first of two switchable resistors is connected and the second of two switchable resistors is not connected, the voltage characteristics 521 and 522 do not exceed the defined threshold value 510.

After 100 ms there is an alternating exchange of the two switchable resistors. In a second state in which the second of two switchable resistors is connected and the first of two switchable resistors is not connected, the voltage characteristics 521 and 522 ultimately exceed the defined threshold value 510. The switching state of the respective mechanical switch can be correctly determined. Switching in the resistor leads to an amplification or modification of the voltage dropping at the respective mechanical switch.

It can be seen that the present disclosure, particularly according to the various forms claimed in the claims, is independent of the existing boundary conditions and/or system parameters in a high-voltage system. Reliable recognition and/or monitoring of the switching state of a mechanical switch is possible. Furthermore, recognizing and/or monitoring the switching state of a mechanical switch is simple and reliable since only one measurement of a voltage characteristic of the voltage dropping at a mechanical switch is made and compared to a defined threshold value.

The various forms described in this specification and optional features and properties given in relation to them should also be understood as being disclosed in all combinations thereof. Specifically, the description of a feature encompassed by one form—insofar as there is not an explicit declaration to the contrary—should not be understood here to mean that the feature is indispensable or essential to the function of that form. The sequence of the method steps described in this specification is not mandatory; alternative sequences of the method steps are conceivable. The method steps can be implemented in various ways. Thus, implementation in software (by programming instructions), hardware or a combination of the two is conceivable for implementation of the method steps.

Terms used in the claims such as "include," "have," "comprise," "contain" and/or the like do not rule out other elements or steps. The expression "at least partly" covers the cases of being both "partly" and "completely." On the other hand, the expression "and/or" should be understood as meaning that not only the alternative, but also the combination is to be disclosed. Hence, "A and/or B" means: "(A) or (B) or (A and B)." Use of the indefinite article does not rule out a plural. A single apparatus can perform the function of several units or devices given in the claims. Reference numbers given in the claims shall not be viewed as posing restrictions on the means and/or steps used.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A circuit for monitoring a switching state of a mechanical switch, the circuit comprising:
   a first mechanical switch configured to couple a high-voltage power storage device to a load;
   a measuring device configured to measure a voltage characteristic at the first mechanical switch, wherein the measuring device is capable of being switched to the first mechanical switch via a first measuring resistor such that a voltage drop at the first mechanical switch is measurable over a period of time;
   an insulation-monitoring unit having a first switchable resistor, a first switch connected in series with the first switchable resistor, a second switchable resistor, and a second switch connected in series with the second switchable resistor, wherein the first switchable resistor is capable of being switched in, by way of the first switch, during the measurement of the voltage characteristic at the first mechanical switch, wherein the second switchable resistor is capable of being switched in, by way of the second switch, during the measurement of the voltage characteristic at the first mechanical switch, wherein a voltage divider formed by two or more insulation resistors of the high-voltage power storage device is modifiable by the switching in of at least one of the first switchable resistor and the second switchable resistor; and an evaluation device configured to compare the measured voltage characteristic at the first mechanical switch with a predefined threshold value such that the switching state of the first mechanical switch is determined.

2. The circuit according to claim 1, wherein the evaluation device supplies a signal based on the comparison, wherein the signal indicates that the first mechanical switch is open when the predefined threshold value is exceeded, and/or with the signal indicates that the first mechanical switch is closed when the predefined threshold value is undershot.

3. The circuit according to claim 1, wherein the first and the second switchable resistors of the insulation-monitoring unit are alternately switchable.

4. The circuit according to claim 1 further comprising a second mechanical switch configured to couple the high-voltage power storage device to the load.

5. The circuit according to claim 4, wherein the measuring device is connectable to the second mechanical switch via a third measuring resistor such that a voltage drop at the second mechanical switch is measurable over a period of time.

6. The circuit according to claim 1 further comprising a supply line and a ground conductor, wherein the first switchable resistor is switchably connected to the supply line and the second switchable resistor is switchably connected to the ground conductor.

7. The circuit according to claim 1, wherein the first and the second switchable resistors are connected in series, with an equipotential predominating between the first and the second switchable resistors.

8. The circuit according to claim 1, wherein at least one of the measuring device and the insulation-monitoring unit is arranged between the high-voltage power storage device and the load and is parallel connected to the high-voltage power storage device and the load.

9. The circuit according to claim 8, wherein the first mechanical switch is arranged between the measuring device and the load, wherein the load is disconnected from the high-voltage power storage device, the insulation-monitoring unit, and the measuring device when the first mechanical switch is open.

10. The circuit according to claim 9, wherein the connection from the high-voltage power storage device and the load is in the following order:
the high-voltage power storage device;
the insulation-monitoring unit;
the measuring device;
the first mechanical switch; and
the load.

11. The circuit according to claim 4, wherein the first mechanical switch or the first and the second mechanical switches are arranged between the measuring device and the load, wherein the load is disconnected from the high-voltage power storage device, the insulation-monitoring unit, and the measuring device when the first mechanical switch and/or second mechanical switch is open.

12. The circuit according to claim 4, wherein the connection from the high-voltage power storage device and the load is in the following order:
the high-voltage power storage device;
the insulation-monitoring unit;
the measuring device;
the first mechanical switch or the first and second mechanical switches; and
the load.

13. A method for monitoring a switching state of a mechanical switch, the method comprising the steps of:
measuring a voltage characteristic at a first mechanical switch, the first mechanical switch configured to couple a high-voltage power storage device to a load, wherein a voltage drop at the first mechanical switch is measured over a period of time;
switching in at least one of a first switchable resistor and a second switchable resistor of an insulation-monitoring unit during the measurement of the voltage characteristic at the first mechanical switch by way of a first switch and a second switch, respectively, wherein the first switch is connected in series to the first switchable resistor, the second switch is connected in series to the second switchable resistor, and a voltage divider formed by at least two insulation resistors of the high-voltage power storage device is modified by the switching in of at least one of the first switchable resistor and the second switchable resistor; and
determining the switching state of the first mechanical switch based on the measured voltage characteristic at the first mechanical switch, wherein determining the switching state includes comparing the measured voltage characteristic at the first mechanical switch with a predefined threshold value.

14. The method according to claim 13 further comprising the step of:
supplying a signal indicating that the first mechanical switch is open if the predefined threshold value is exceeded and/or indicating that the first mechanical switch is closed if the predefined threshold value is undershot.

15. The method according to claim 14 further comprising the step of:
alternating the switching in of the first switchable resistor and of the second switchable resistor of the insulation-monitoring unit.

16. The method according to claim 13 further comprising the step of:
alternating the switching in of the first switchable resistor and of the second switchable resistor of the insulation-monitoring unit.

17. The method according to claim 13 further comprising the step of:
measuring a voltage characteristic at a second mechanical switch, the second mechanical switch configured to couple the high-voltage power storage device and the load, wherein a voltage drop at the second mechanical switch is measured over a period of time.

18. The method according to claim 13 further comprising the steps of:
alternating the switching in of the first switchable resistor and of the second switchable resistor of the insulation-monitoring unit; and
measuring a voltage characteristic at a second mechanical switch, the second mechanical switch configured to couple the high-voltage power storage device and the load, wherein a voltage drop at the second mechanical switch is measured over a period of time.

\* \* \* \* \*